US008873339B2

(12) United States Patent
Chen

(10) Patent No.: US 8,873,339 B2
(45) Date of Patent: Oct. 28, 2014

(54) METHOD AND APPARATUS FOR A CLOCK AND SIGNAL DISTRIBUTION NETWORK FOR A 60 GHZ TRANSMITTER SYSTEM

(75) Inventor: Jiashu Chen, Berkeley, CA (US)

(73) Assignee: Tensorcom, Inc., Carlsbad, CA (US)

( * ) Notice: Subject to any disclaimer, the term of this patent is extended or adjusted under 35 U.S.C. 154(b) by 118 days.

(21) Appl. No.: 13/572,519

(22) Filed: Aug. 10, 2012

(65) Prior Publication Data

US 2014/0043104 A1    Feb. 13, 2014

(51) Int. Cl.
| H04B 1/02 | (2006.01) |
| H03B 27/00 | (2006.01) |
| G01S 7/491 | (2006.01) |
| G01S 7/484 | (2006.01) |
| G01S 5/02 | (2010.01) |

(52) U.S. Cl.
CPC .................. *H03B 27/00* (2013.01); *G01S 7/484* (2013.01); *G01S 5/0226* (2013.01); *G01S 7/4911* (2013.01)
USPC ............. 367/137; 367/117; 367/138; 342/59; 342/112; 342/129; 342/130; 342/368; 342/463; 342/464; 706/24; 455/103; 331/60

(58) Field of Classification Search
CPC ..... H03B 27/00; G01S 5/0226; G01S 7/4911; G01S 7/484
USPC ........... 342/59, 112, 129, 130, 368, 463, 464; 331/60; 367/117, 137, 138; 706/24; 455/103
See application file for complete search history.

(56) References Cited

U.S. PATENT DOCUMENTS

| 3,991,381 A | 11/1976 | Sechi |
| 4,901,032 A | 2/1990 | Komiak |
| 5,162,755 A | 11/1992 | Mara et al. |
| 5,276,406 A | 1/1994 | Samay et al. |
| 5,574,402 A | 11/1996 | Nakajima et al. |
| 5,596,325 A * | 1/1997 | Maas .............................. 342/28 |
| 5,736,901 A | 4/1998 | Nakamura et al. |
| 6,377,124 B1 | 4/2002 | Brandt |
| 7,570,111 B1 | 8/2009 | Vagher et al. |
| 8,451,058 B2 | 5/2013 | Cui et al. |

(Continued)

OTHER PUBLICATIONS

U.S. Appl. No. 13/243,986, Zaw Soe.

(Continued)

*Primary Examiner* — Arnold Kinkead
*Assistant Examiner* — Richard Tan
(74) *Attorney, Agent, or Firm* — Thaddeus Gabara; Tyrean Patent Prosecution Law Firm

(57) ABSTRACT

Herein is presented, a low power on-die 60 GHz distribution network for a beamforming system that can be scaled as the number of transmitters increases. The transmission line based power splitters and quadrature hybrids whose size would be proportional to a quarter wavelength (~600 μm) if formed using transmission lines are instead constructed by inductors/capacitors and reduce the area by more than 80%. An input in-phase I clock and an input quadrature Q clock are combined into a single composite clock waveform locking the phase relation between the in-phase I clock and quadrature Q clock. The composite clock is transferred over a single transmission line formed using a Co-planar Waveguide (CPW) coupling the source and destination locations over the surface of a die. Once the individuals the in-phase I and quadrature Q clocks are required, they can be generated at the destination from the composite clock waveform.

10 Claims, 8 Drawing Sheets

(56) References Cited

U.S. PATENT DOCUMENTS

| | | |
|---|---|---|
| 8,514,007 B1* | 8/2013 | Ahmed et al. ............... 327/355 |
| 2004/0007776 A1* | 1/2004 | Chen ............................. 257/738 |
| 2004/0121745 A1 | 6/2004 | Meck |
| 2006/0030277 A1 | 2/2006 | Cyr |
| 2006/0261890 A1 | 11/2006 | Floyd |
| 2007/0160168 A1 | 7/2007 | Beukema |
| 2008/0132180 A1 | 6/2008 | Manicone |
| 2008/0290947 A1 | 11/2008 | Dawe |
| 2009/0316846 A1 | 12/2009 | Rofougaran |
| 2010/0117733 A1 | 5/2010 | Hajimiri |
| 2010/0142416 A1 | 6/2010 | Kim |
| 2010/0164633 A1* | 7/2010 | Hoshino et al. .............. 331/17 |
| 2012/0182906 A1* | 7/2012 | Knox ............................ 370/278 |

OTHER PUBLICATIONS

U.S. Appl. No. 13/552,943, HungYu

U.S. Appl. No. 13/552,955, Joel Balbien et al.

Alberto Valdes-Garcia, et al. "A Fully Integrated 16-Element Phased-Array Transmitter in SiGe BiCMOS for 60-GHz Communications" IEEE J. Solid-State Circuits, vol. 45, No. 12, pp. 2757-2773, Dec. 2010.

C. Marcu et al., "A 90 nm CMOS low-power 60-GHz transceiver with integrated baseband circuitry," IEEE J. Solid-State Circuits, vol. 44, No. 12, pp. 3434-3447, Dec. 2009.

47 CFR § 15,257 Operation within the band 57-64 GHz.

* cited by examiner

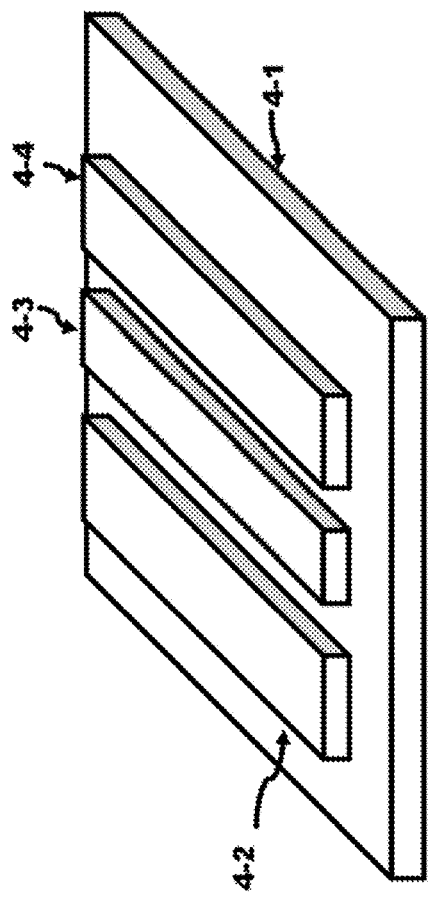
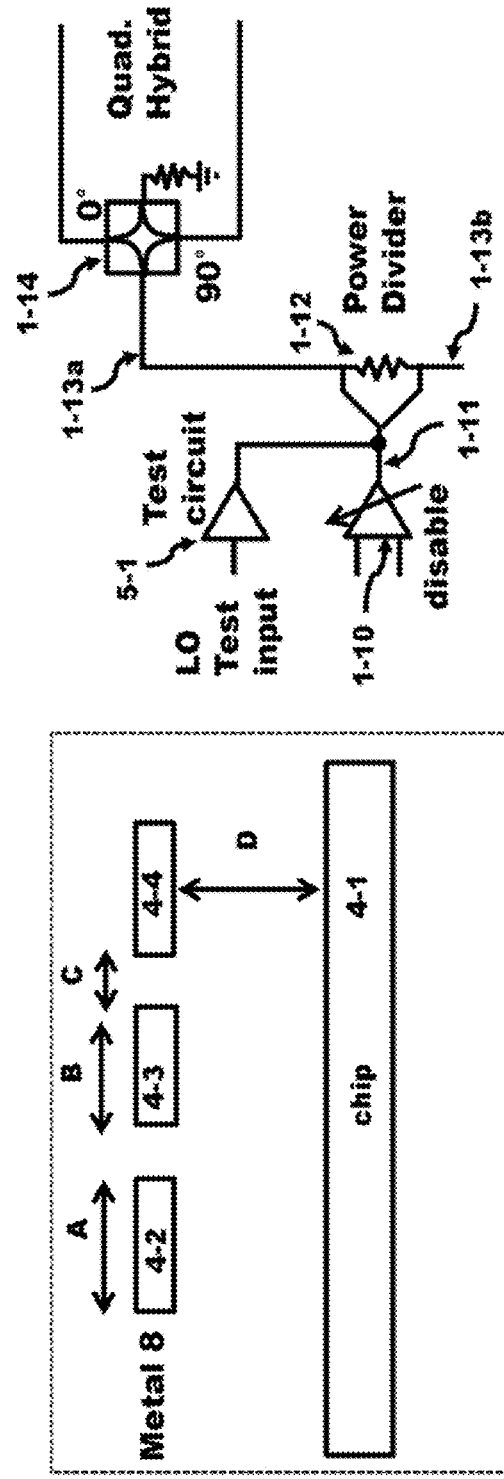
FIG. 4a
FIG. 4b
FIG. 5a

METHOD AND APPARATUS FOR A CLOCK AND SIGNAL DISTRIBUTION NETWORK FOR A 60 GHZ TRANSMITTER SYSTEM

CROSS-REFERENCE TO RELATED APPLICATIONS

The present application is related to the co-tiled U.S. application Ser. No. 13/572,522 entitled "Method and Apparatus for a Class-E Load Tuned Beamforming 60 GHz Transmitter" filed on Aug. 10, 2012, which is assigned to the same assignee as the present application and invented by the same inventor as the present application and incorporated herein by reference in its entirety.

BACKGROUND OF THE INVENTION

The Federal Communications Commission (FCC) has allotted a spectrum of bandwidth in the 60 GHz frequency range (57 to 64 GHz). The Wireless Gigabit Alliance (WiGig) targets the standardization of this frequency band that will support data transmission rates up to 7 Gbps. Integrated circuits, formed in semiconductor die, offer high frequency operation in this millimeter wavelength range of frequencies. Some of these integrated circuits utilize Complementary Metal Oxide Semiconductor (CMOS), Silicon-Germanium (SiGe) or GaAs (Gallium Arsenide) technology to form the dice in these designs.

CMOS (Complementary Metal Oxide Semiconductor) is the primary technology used to construct integrated circuits. N-channel transistors and P-channel transistors (MOS transistor) are used in this technology which uses fine line technology to consistently reduce the channel length of the MOS transistors. Current channel length examples are 40 nm, the power supply of VDD equals 1.2V and the number of layers of metal levels can be 8 or more. This technology typically scales with technology and can achieve operation in the 60 GHz range.

Transceivers for the 60 GHz system have been formed in CMOS and comprise at least one transmitter and at least one receiver which are used to interface to other transceivers in a communication system. The transceivers receive or transmit electrical signals into the LNA or the power amplifier, respectively. These electrical signals are generated by or provided to an antenna. The antenna is a transducer that converts incoming electromagnetic energy from free space into electrical signals on the receive side of the transceiver or converts electrical signals into electromagnetic energy for transfer into free space.

Conventionally, the design of circuits at 60 GHz requires careful layout. One traditional way to distribute a 60 GHz clock is to use transmission line based power splitters and quadrature hybrids whose size are proportional to a quarter wavelength (~600 um). Therefore, the entire distribution network occupies significant area if the circuit components are formed using transmission lines (for example, see the passive power splitter in FIG. 7 of Alberto Valdes-Garcia, et al. "A Fully Integrated 16-Element Phased-Array Transmitter in SiGe BiCMOS for 60-GHz Communications" IEEE J. Solid-State Circuits, vol. 45, no. 12, pp. 2757-2773, December 2010 and see the quadrature hybrid layout in FIG. 9 of C. Marcu et al., "A 90 nm CMOS low-power 60-GHz transceiver with integrated baseband circuitry," IEEE J. Solid-State Circuits, vol. 44, no. 12, pp. 3434-3447, December 2009). The in-phase clock and quadrature phase clock are applied to these circuit components as these clocks are routed on the surface of the die. Furthermore, the routing from, around and between these circuit components requires power to be dissipated for each interconnect of the in-phase clock and quadrature phase clock traces. In addition, the layout needs to allow the in-phase clock and quadrature phase clock to maintain their 90° separation as these clocks are routed from the source location to their destination location. To overcome this shortcoming, a solution is herein provided that reduces the power dissipation and area of routing these clock lines on a semiconductor die.

As mentioned above, some circuit components required in multi-tens of GHz clock network distribution designs have been fabricated using transmission lines on the die. However, these circuit components formed on the die would use up valuable real-estate on the semiconductor substrate. For example, a quarter wavelength at 60 GHz is 0.6 mm which is a length that may equal the width of a semiconductor die. Thus, the integration of these transmission line circuit components into the semiconductor die would use a significant portion of the area of the die. A solution to reduce the real estate of these circuit components integrated on a die is provided to overcome this shortcoming.

The transmitter needs to provide a signal to the antenna consisting of the fundamental frequency. Furthermore, the power amplifier (PA) in the transmitting circuit should be designed to minimize power dissipation and maximize the energy transfer to the antenna. In addition, the power amplifier to perform these functions should minimize transistor usage particularly cascode-like structures since the available head room is only about 500-600 mV which is about half of the 1.2V power supply. A solution to maximize energy transfer and minimize second order harmonics from appearing at the output of the power amplifier is provided to overcome this shortcoming.

Second harmonics due to the non-linear behavior of the transistor introduces an additional difficulty in power amplifier design. These second harmonics can distort the desired waveform at the antenna and reduce the purity of the desired signal being transferred. Several solutions are presented to remove these second order distortions as well as using them advantageously to improve the quality of the signal being delivered to the antenna.

The transmitters and receivers for the 60 GHz radio system can be coupled to form a SIMO (Single Input Multiple Output) system. This system would use more than one antenna at the transmitter to steer the beam to an antenna located on the receiver. The outputs generated from the multiple output antennas will be received by the single receive antenna and provide an increased data throughput and link range without increasing the total output power or signal bandwidth.

The transceivers and receivers for the 60 GHz radio system can be coupled to form a MIMO (Multiple Input Multiple Output) system. This system would use more than one antenna at the transmitter and more than one antenna for the receiver. The outputs generated from the multiple output antennas will be received by the multiple receiver antennas providing increased data throughput and link range without increasing the total output power or signal bandwidth.

BRIEF SUMMARY OF THE INVENTION

The following is a summary and thus contains, by necessity, simplification, generalizations, and omission of detail; consequently, those skilled in the art will appreciate that this summary is illustrative only and is not intended to be in any way limiting. Various embodiments and aspects of the inventions, as defined by the appended claims, will be described with reference to details discussed below, and the accompanying drawings will illustrate the various embodiments.

Numerous specific details are described to provide a thorough understanding of various embodiments of the present invention.

An embodiment is presented to form the power divider and quadrature hybrid from lumped capacitors and inductors instead of using transmission lines to form these capacitors and inductors. The sinusoidal combiner also uses lumped capacitors and inductors. Transmission lines require more area to emulate the equivalent capacitance and inductance of lumped capacitors and inductors. Using lumped capacitors and inductors reduces the area usage by as much as 80%. In addition, the insertion loss would decrease by the square root of the area used since the resistive loss would be proportional to the length of the traces used to form the transmission lines or lumped elements.

Another embodiment is to combine an input in-phase clock and an input quadrature clock into a composite 60 GHz clock waveform. The circuit combines the two 60 GHz input clocks using a parallel set of cascode transistors that is coupled to an LC tank circuit tuned to operate at 60 GHz. The inputs drive the gates of the cascode devices providing gain and excitation of the tank circuit. The composite 60 GHz clock waveform is then coupled to the rest of the clock network circuit components.

A further embodiment is to couple the composite 60 GHz clock waveform as a single transmission line between the source and destination locations. The transmission line can be formed as a Co-planar Waveguide (CPW) to couple the circuit components of the clock network between the source and destination. Since the in-phase I and quadrature Q clocks have been combined in the composite clock waveform, only one clock line needs to be distributed over the surface of a die. The advantage is that the phase relation between the in-phase I and quadrature Q clocks are locked or frozen within the composite clock waveform. Once the individual in-phase I and quadrature Q clocks are required, they can be generated at the destination from the composite clock waveform.

Another embodiment creates a low power 60 GHz distribution network that can be scaled as the number of transmitters is increased. The composite 60 GHz clock offers the ability to transfer the I and Q clocks over the surface of the die to multiple transmitters, multiple receivers or both multiple transmitters and multiple receivers using less power and less area.

An embodiment of the transmitter is the unique design of the class-E amplifier that can be tuned to pass only the fundamental frequency to the antenna. This provides a very efficient design by optimizing the second harmonics at the drain of the PA transistor. This occurs by coupling a CPW and a series capacitor between the PA transistor and the load. The combination of these two elements forms a band pass filter that only allows the fundamental frequency to pass to the load of the antenna.

A further embodiment is to use a supply inductor to couple the drain of the PA transistor to the power supply. The supply inductor does not behave as an RF choke at either the fundamental or second harmonic. Instead, the supply inductor is tuned at the second harmonic with the parasitic capacitance of the drain of the PA transistor. Then, a load capacitance which is located on the output signal pad is adjusted at the fundamental frequency to insure that the current waveform and voltage waveforms at the drain of the PA transistor do not overlap. This feature minimizes the parasitic power dissipation and allows for the energy to be applied to the antenna.

In another embodiment, the pre-driver stage of the PA is designed as a Class-A stage, maximizing the voltage swing delivered to the gate of the PA switch or transistor. To minimize the inductive coupling between the pre-driver stage and the PA (Power amplifier) stage and in turn ensure PA stability, the resonance network of the driver stage is implemented by a load formed by a CPW line coupled to the supply and an AC coupling capacitor coupling the drain of the pre-driver to the gate of the PA transistor.

BRIEF DESCRIPTION OF THE DRAWINGS

Please note that the drawings shown in this specification may not necessarily be drawn to scale and the relative dimensions of various elements in the diagrams are depicted schematically. The inventions presented here may be embodied in many different forms and should not be construed as limited to the embodiments set forth herein. Rather, these embodiments are provided so that this disclosure will be thorough and complete, and will fully convey the scope of the invention to those skilled in the art. In other instances, well-known structures and functions have not been shown or described in detail to avoid unnecessarily obscuring the description of the embodiment of the invention. Like numbers refer to like elements in the diagrams.

FIG. 4a illustrates a 3-D representation of the co-planar waveguide in accordance with the present invention.

FIG. 4b shows the cross section of the die illustrating the co-planar waveguide in accordance with the present invention.

FIG. 5a presents the location of the test point driven externally in the circuit of FIG. 1a in accordance with the present invention.

DETAILED DESCRIPTION OF THE INVENTION

Figure 1A:
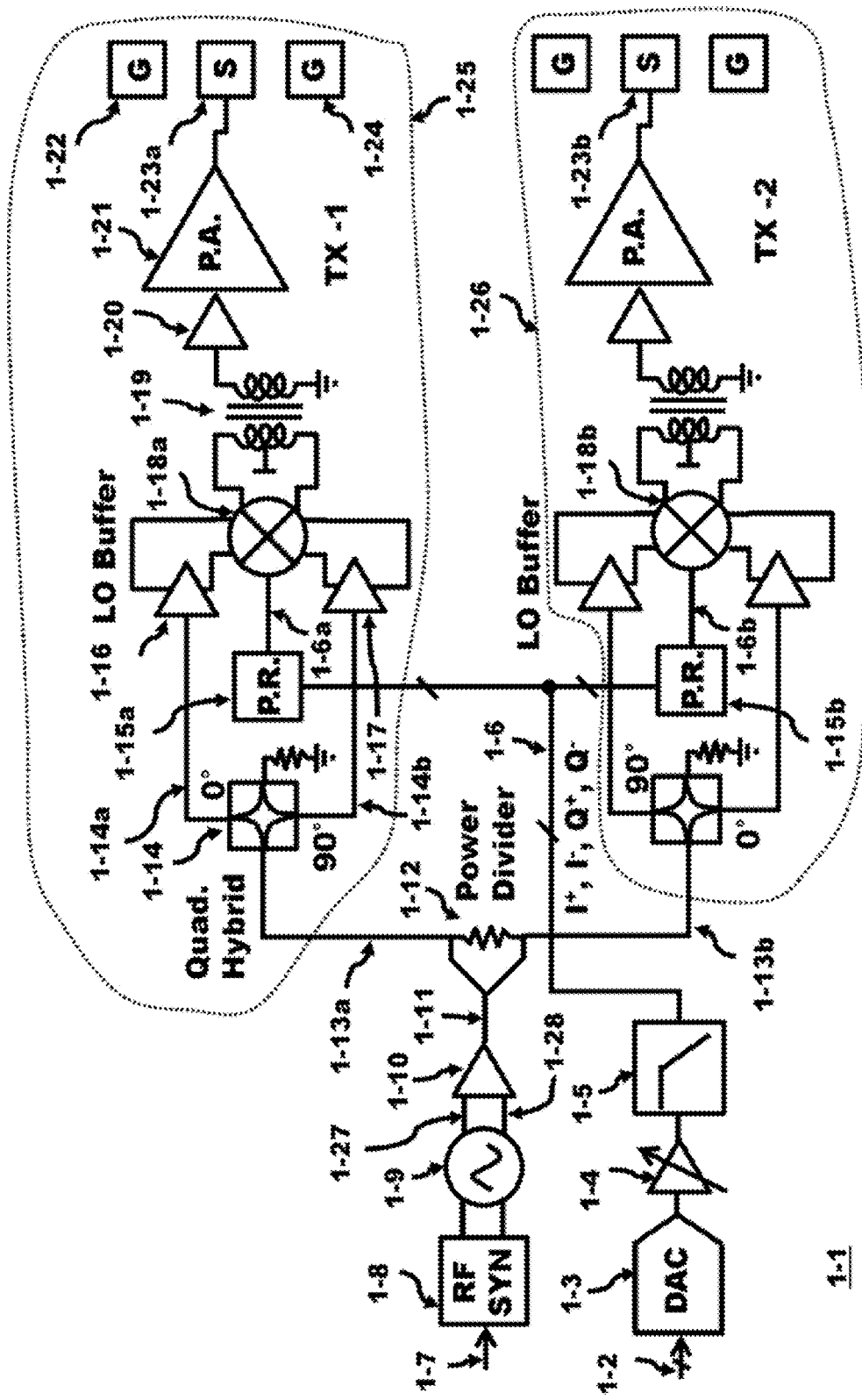
FIG. 1a depicts a two-element beamforming transmitter circuit in accordance with the present invention.

FIG. 1a illustrates 2 two element beamforming transmitter 1-1 that is applicable for a 60 GHz system. For an example of a single transmitter circuit, see U.S. patent application Ser. No. 13/243,986, filed Sep. 23, 2011 by Zaw Soe under the title, "Method and Apparatus of Minimizing Extrinsic Parasitic Resistance in 60 GHz Power Amplifier Circuits" commonly assigned herewith, describes a transmitter circuit and techniques, suitable for driving an antenna and is incorporated herein by reference in its entirety. The digital baseband signal 1-2 is applied to the DAC (Digital to Analog Converter) 1-3. The DAC converts the digital signal to an analog signal. The variable gain amplifier 1-4 applies the amplified signal to the low pass filter 1-5. The bussed output 1-6 of the low pass filter 1-5 provides the $I^+$, $I^-$, $Q^+$, and the $Q^-$ baseband signals. The in-phase I baseband signals are 90° out of phase with the quadrature Q baseband signals. The $I^-$ baseband signal is 180° out of phase with the $I^+$ baseband signal and the $Q^-$ baseband signal is 180° out of phase with the $Q^+$ baseband signal. These baseband signals are carried by the bus 1-6 and are applied to the phase rotator 1-15a of the first transmitter 1-25 and the phase rotator 1-15b of the second transmitter 1-26. The phase rotator 1-15a also receives a first digital control (not shown) which shifts the phase of the input in-phase I and quadrature Q baseband signals 1-6 into an output in-phase I' and quadrature Q' baseband signals onto bus 1-6a with a phase dependent on the first digital control. The rotated baseband signal on bus 1-6a is applied to the composite mixer 1-18a. Similarly, the phase rotator 1-15b also receives a second digital control (not shown) which shifts the phase of the input in-phase I and quadrature Q baseband signals 1-6 into an output in-phase I" and quadrature Q" baseband signals onto bus 1-6b with a phase dependent on the second digital control. The first digital control and the second digital control adjust the gain of several variable gain amplifiers in each phase rotator (circuit configuration to be presented shortly) to provide the rotated signal that is comprised of a phase shifted in-phase I and quadrature Q signals. The rotated signal on bus 1-6b is applied to the mixer 1-18b. The first and second digital controls are generated by unit comprising a control block and memory (not illustrated). The first and second digital controls may be different or identical and are applied to the phase rotators 1-15a and 1-15b.

The rotated in-phase I and quadrature Q baseband output signals of the phase rotators at busses 1-6a and 1-6b alter the output waveform of the transmitters. These waveforms are applied to the antennas to propagate the up-converted signals into free space. The phase relations of the two propagated signals or waveforms then cause a constructive or destructive interference between the waveforms such that a beam with greater intensity or less intensity, respectively, can be formed at a particular location in free space. Thus, the phase rotators allow the beam to be steered depending on the values of the first and second digital controls. The signals in FIG. 1a entering the transmitters 1-25 are the clock on transmission line 1-13a and the baseband signal on bus 1-6. Similarly, the clock on transmission line 1-13b and the baseband signal on bus 1-6 enter the transmitter 1-26. These digital controls are used to steer the composite beam formed by a first and a second antenna. For an example of an antenna design, see U.S. patent application Ser. No. 13/552,943, filed Jul. 19, 2012 by Hung-Yu Yang under the title, "Method and Apparatus for a 60 GHz Endfire Antenna" commonly assigned herewith, describes an endfire antenna and is incorporated herein by reference in its entirety.

The beam steering technique can be expanded to include more than two transmitters and their associated antennas as will be shown shortly. For an example of another form of steerable antenna design, see U.S. patent application Ser. No. 13/552,955, filed Jul. 19, 2012 by Joel Balbien et al. under the title, "Method and Apparatus for the Alignment of a 60 GHz Endfire Antenna" commonly assigned herewith, describes a way of steering endfire antennas and is incorporated herein by reference in its entirety.

The LO (local oscillator) clock path in FIG. 1a to generate the high-frequency 60 GHz clock starts from the input 1-7. An RF synthesizer 1-8 receives the control 1-7 to adjust the characteristics of the quadrature VCO (Voltage Controlled Oscillator) 1-9 to oscillate over the frequency range including 57-66 GHz. The quadrature VCO 1-9 is a quadrature balanced output oscillator generating an in-phase I clock 1-27, an inverted in-phase $I^-$ clock, a quadrature phase Q clock 1-28 and an inverted quadrature phase $Q^-$ clock operating at 60 GHz. Two of these clock outputs 1-27 and 1-28 of the quadrature VCO 1-9 are applied to a sinusoidal combiner 1-10. The remaining clock outputs of the quadrature VCO 1-9 are loaded with an equivalent dummy load to insure that the VCO outputs are equally balanced. The in-phase I clock 1-27 and quadrature phase Q clock 1-28 are combined together by the sinusoidal combiner 1-10 into a single combined clock and driven onto the transmission line 1-11. This single transmission line is applied to the power divider 1-12 generating an equivalent combined clock on transmission lines 1-13a and 1-13b. The power of the combined clocks on transmission lines 1-13a and 1-13b is reduced by half (by 3 dB) compared to the power on transmission line 1-11. There may also be an insertion loss due to the power divider. The combined clock on the two transmission lines 1-13a and 1-13b are applied to the transmitter 1-25 and 1-26, respectively. The circuit components within both of the transmitters are substantially identical.

The clock on transmission line 1-13a is applied to the quadrature hybrid 1-14 which recovers two output clocks on transmission lines 1-14a and 1-14b. The output clocks on these transmission lines are substantially separated from one another by a 90° phase shift and are substantially equivalent to the original in-phase I clock 1-27 and quadrature phase Q clock 1-28. The two recovered output clocks on transmission lines 1-14a and 1-14b also suffer an insertion loss due to the quadrature hybrid. The 0° phase shift clock on transmission line 1-14a is applied to the LO buffer 1-16 while the 90° phase shift clock on transmission line 1-14b is applied to the LO buffer 1-17. The LO buffer receives a single clock and generates two amplified output clocks. The two outputs of the LO buffer 1-16 generate an equivalent representation of the clock I that was on transmission line 1-27 and generates the corresponding inverse clock $I^-$ that is 180° out of phase with the output I. The local oscillator buffer 1-17 generates an equivalent representation of the clock Q that was on transmission line 1-28 and generates the corresponding inverse clock $Q^-$ that is 180° out of phase with the output Q.

Power is saved by transporting a combined (I and Q) clock on a single transmission line instead of two separate transmission lines each carrying an in-phase clock I and a quadrature clock Q. As the distance between circuit components are increased over the die, the power saving increases correspondingly. The two separate transmission lines approach would suffer; 1) an increased area penalty; and 2) difficulty in maintaining a 90° separation between the two tapped clocks from their transmission lines over the area of the die. Besides power and area savings, the phase relation between the in-phase I and quadrature Q clocks in the composite clock waveform is locked or frozen until they are separated into their component parts at the destination. This alleviates the concern discussed in the second issue provided above.

The sinusoidal combiner 1-10, the power divider 1-12, the quadrature hybrid 1-14 and the local oscillator buffers 1-16 and 1-17 are circuit components that are spread out over the area of the die. The inventive technique of transporting the single combined clock alleviates the two prior concerns. For example, the single combined clock on transmission line 1-11 from the sinusoidal combiner is applied to the power divider 1-12. The power divider 1-12 then generates the single combined clock on transmission line 1-13a which is applied to the quadrature hybrid 1-14. The quadrature hybrid then transforms the single combined clock into two single recovered clocks on transmission lines 1-14a and 1-14b separated by 90° which are applied to the local oscillator buffers 1-16 and 1-17. The local oscillator buffers 1-16 and 1-17 generate two sets of differential outputs. The first set of differential outputs includes the first output clock of the local oscillator 1-16 which amplifies the input clock on transmission line 1-14a while the other output clock is 180° out of phase with the input clock. The second set of differential outputs includes the first output clock of the local oscillator buffer 1-17 which amplifies the input clock on transmission line 1-14b while the other output clock is 180° out of phase with the input clock. These two sets of differential output clocks from the local oscillator buffers are applied to the mixer 1-18 to up-convert the signal on 1-6a. Note that these two sets of differential in-phase I and quadrature Q signals applied to the mixer 1-18a are the first occurrence of differential signals since the single combined clock has been generated at the output of the sinusoidal combiner 1-10. The power dissipation of transferring the single combined clock from the output of the sinusoidal combiner 1-10 to the composite mixer 1-18a has been reduced by nearly 3 dB.

The composite mixer 1-18a is formed from Gilbert multipliers. The up-converted outputs of the Gilbert multiplier are applied to each end of the center tapped coil of the transformer 1-19. The outputs of the second coil of the transformer are AC grounded at one end while the second end is applied to the pre-driver 1-20 forming a balun. The output of the pre-driver 1-20 provides impedance matching and drives the power amplifier 1-21 which provides the final output up-converted signal to the pad 1-23a. Note that the signal pad 1-23a is surrounded by two ground pads 1-22 and 1-24 to provide a good ground reference. The second output of the power divider on transmission line 1-13b is applied to the second transmitter chain 1-26 and generates an equivalent up-converted signal at its corresponding signal pad S 1-23b if the digital weights applied to the phase rotators 1-15a and 1-15b are identical.

Figure 1B:
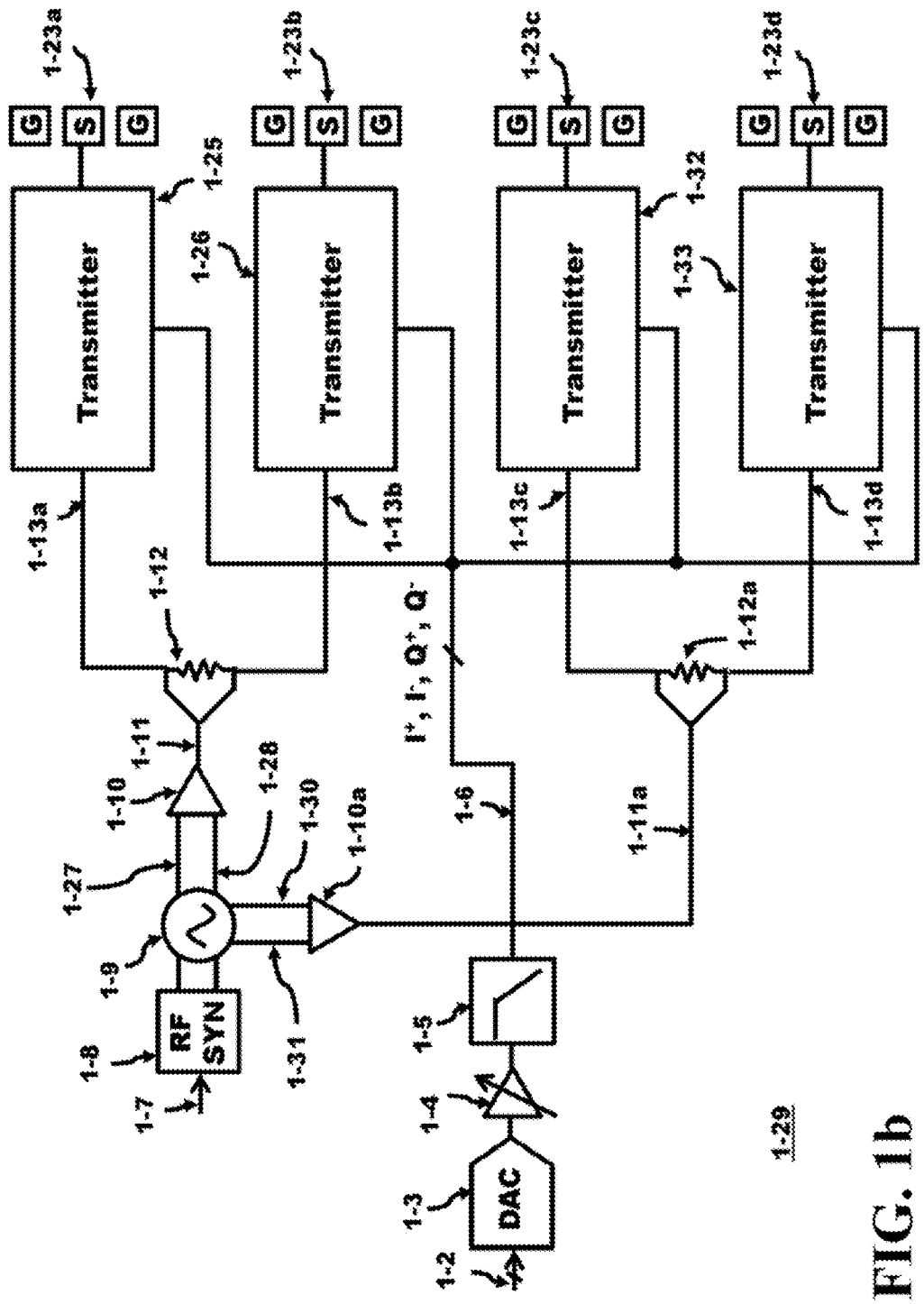
FIG. 1b depicts a four-element beamforming transmitter circuit in accordance with the present invention.

FIG. 1b presents an LO clock distribution system that comprises greater than two transmitters. Although the LO clock distribution system is used for the transmitters, a similar network can also be used to clock a multiple input receiver architecture. The digital baseband signal 1-2 is applied to the DAC (Digital to Analog Converter) 1-3. The DAC converts the digital signal to an analog signal. The variable gain amplifier 1-4 applies the amplified signal to the low pass filter 1-5. The bussed output of the low pass filter 1-6 provides the I$^+$, I$^-$, Q$^+$, and the Q$^-$ baseband signals. These signals are carried by the bus 1-6 and are applied to the phase rotators within the transmitters 1-25, 1-26, 1-32 and 1-33. These phase rotators within these transmitters also receive a first, second, third and fourth digital controls (not shown) which combines the applied input bussed in-phase I and quadrature Q signals 1-6 into a composite signal with a phase between that of the applied input in-phase I and quadrature Q signals dependent on the values of the first, second, third and fourth digital control.

The combined in-phase I and quadrature Q output signals of the phase rotators alter the output waveform of each of the transmitters. These waveforms are applied to the antennas to propagate the signals into free space. The phase relations of the four propagated up-converted signals or waveforms then cause a constructive and destructive interference between the waveforms such that a beam with greater intensity can be formed at particular locations in free space. Thus, the phase rotators allow the beam to be steered depending on the values of the first, second, third and fourth digital controls. The only signals shown entering the transmitters in FIG. 1b are the clocks on the transmission lines 1-13a through 1-13d and the baseband signal 1-6. The first, second, third and fourth digital controls are used to steer the composite beam formed by the four antennas. The beam steering technique can be expanded to include any number of transmitters and their associated antennas.

The quadrature VCO 1-9 generates an in-phase I clock 1-27, an inverted in-phase I$^-$ clock 1-30, a quadrature phase Q clock 1-28 and an inverted quadrature phase Q$^-$ clock 1-31 operating at 60 GHz. Two of these clock outputs 1-27 and 1-28 of the quadrature VCO 1-9 are applied to a sinusoidal combiner 1-10 while the remaining two of these clock outputs 1-30 and 1-31 of the quadrature VCO 1-9 are applied to a sinusoidal combiner 1-10a. This loading insures that all clock outputs of the quadrature VCO 1-9 are equally loaded and that the VCO outputs are equally balanced.

The sinusoidal combiner 1-10 driving the two transmitters 1-25 and 1-26 is equivalent to the circuit components illustrated in FIG. 1a. The sinusoidal combiner 1-10a combines the two clock outputs, the inverted in-phase I$^-$ clock 1-30 and inverted quadrature phase Q$^-$ clock 1-31, together into a single combined clock which drives the single transmission line 1-11a. This single transmission line is applied to the power divider 1-12a generating equivalent combined clocks on transmission lines 1-13c and 1-13d. The power of the combined clocks on transmission lines 1-13c and 1-13d is reduced by half (by 3 dB) compared to the power on transmission line 1-11a. There may also be an insertion loss due to the power divider. The combined clock on the two transmission lines 1-13c and 1-13d are applied to the transmitter 1-32 and 1-33, respectively. The output of the two transmitters 1-32 and 1-33 provide their final output signal to the pads 1-23c and 1-23d, respectively. Note that the signal pads 1-23c and 1-23d are surrounded by two ground pads to provide a good ground reference. These pads are coupled to the antennas which generate a steered beam waveform that propagates into free space. The circuit components within all of the transmitters are substantially identical.

Figure 2B:
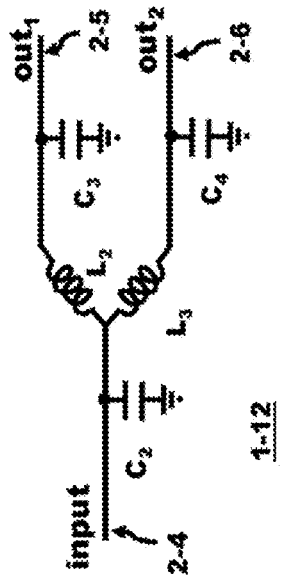
FIG. 2b depicts a lumped component Wilkinson power divider in accordance with the present invention.
Figure 2D:
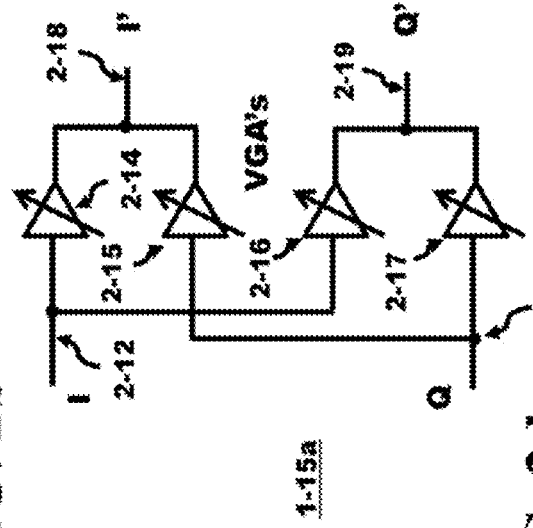
FIG. 2d presents the variable gain amplifiers configured as a phase rotator in accordance with the present invention.
Figure 2A:
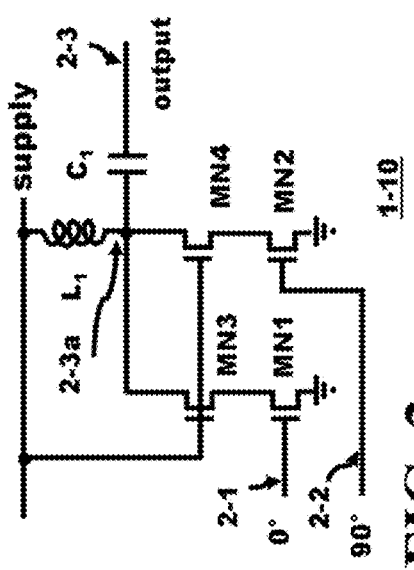
FIG. 2a illustrates the circuit schematic of the amplifier combining two sinusoidal waveforms in accordance with the present invention.

FIG. 2a illustrates the circuit diagram of the sinusoidal combiner 1-10 interfacing the quadrature oscillator 1-9 to the power divider 1-12 shown in FIG. 1a. This is also the circuit diagram of the sinusoidal combiner 1-10a interfacing the quadrature oscillator 1-9 to the power divider 1-12a shown in FIG. 1b. The circuit consists of two inputs 2-1 and 2-2. The output is extracted after capacitor $C_1$ at node 2-3. Two cascode structures consisting of n-channel transistors MN1 and MN3 connected in parallel with a second cascode structure consisting n-channel transistors MN2 and MN4. The top transistors MN3 and MN4 of the cascode structures have their gate coupled to the power supply voltage (VDD) while the source of the transistors MN1 and MN2 are coupled to ground or VSS. The common drain 2-3a of the n-channel devices MN3 and MN4 is coupled to the power supply line via $L_1$. The gates of MN3 and MN4 are coupled to the power supply while the gates of MN1 and MN2 are coupled to the outputs of the quadrature oscillator. One output of the quadrature oscillator provides a clock at 0° and a second output of the quadrature oscillator provides a clock at 90°. These two outputs are applied to the input nodes 2-1 and 2-2 of the sinusoidal combiner 1-10, respectively. The common drain node 2-3a is coupled to capacitor $C_1$ to generate the output. The inductor $L_1$ and capacitor $C_1$ form a tank circuit which resonates at the frequency of the quadrature oscillator. The output consists of single clock containing the representation both input clocks 2-1 and 2-2. The clock 2-3 is between 0° and 90° and is at 45° when both cascode structures are identical. This single combined clock output 2-3 carries the two input clocks 2-1 and 2-2. The combined clock output is sent to the power splitter on the chip on a single transmission line.

FIG. 2b illustrates the Wilkinson power splitter 1-12 formed using lumped reactive components. The input is applied at the input node 2-4 which has a capacitor $C_2$ connected to ground and is center tapped to the combined inductor consisting of $L_2$ and $L_3$. The input impedance of the power splitter should be 50Ω. The output of $L_2$ connects to the output node 2-5 to generate $out_1$ and has a capacitor $C_3$ connected to ground. The output of the second inductor of $L_3$ is connected to $out_2$ which is node 2-6 and has a capacitor $C_4$ connected to ground. Both of the outputs have an LC tank circuit coupled to them. The capacitance value of $C_3$ equals the capacitance value of $C_4$ and the inductance value of $L_2$ equals to the inductance value of $L_3$. The inductor $L_2$ and capacitor $C_3$ should provide an output impedance of 50Ω at the node $out_1$. The capacitor $C_2$ has a value which equals to the summation of $C_3$ and $C_4$. As the input clock is applied at the input node 2-4, this circuit generates two identical output clocks at node $out_1$ 2-5 and $out_2$ 2-6 reduced by 3 dB when compared to the input clock 2-4. The inductors and capacitors also have resistive losses which introduces an additional insertion loss.

Figure 2C:
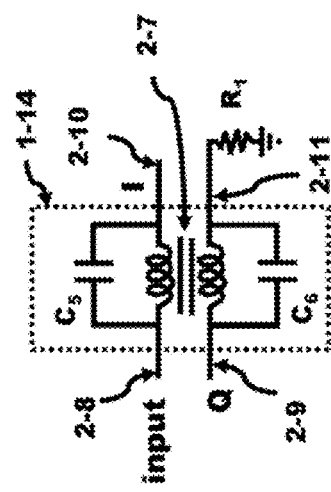
FIG. 2c shows a lumped component 90° quadrature hybrid in accordance with the present invention.

FIG. 2c illustrates the quadrature hybrid 1-14 shown in FIG. 1a which is formed from lumped reactive components. The quadrature hybrid takes an input at node 2-8 and generates two outputs I at node 2-10 and Q at node 2-9. Note that the formation of the quadrature hybrid consists of two inductors that have a mutual coupling forming a transformer 2-7 where across each inductor is a capacitor. A capacitance $C_5$ is in parallel with the top inductor while a capacitance $C_6$ is in parallel with the bottom inductor. The components form a tank circuit. The final output node 2-11 of the quadrature hybrid is coupled to a resistor $R_1$. The quadrature hybrid generates the clocks I and Q where the Q clock is separated from the I clock by 90°.

In FIG. 2a, FIG. 2b and FIG. 2c, the LC tank circuits generate a response at a center frequency with a 0° phase shift. As the input clock is adjusted in frequency from this center frequency over the operating range of 57-66 GHz, the phase shift increases. The system is designed to tolerate this phase shift. The inductors have a diameter ranging from 30 µm to 50 µm and have a relatively small footprint or area usage.

Referring back to FIG. 1a, the single clock on transmission line 1-11 output of the sinusoidal combiner 1-10 is applied to the power divider 1-12. The output of the power divider 1-12 generates two clocks on transmission lines 1-13a and 1-13b each going to separate transmitters 1-25 and 1-26, respectively. In the transmitter 1-25, the single clock on transmission line 1-13a is applied to the quadrature hybrid 1-14 to generate two single ended recovered clocks where one has a phase of 0° 1-14a and the second clock has a phase of 90° on transmission line 1-14b. At this point, the clocks on transmission lines 1-14a and 1-14b are applied to the local oscillator buffers 1-16 and 1-17, respectively. At the output of the local oscillator buffer 1-16, the 0° phase clock and its inverse phase are applied to the composite mixer 1-18a. At the output of the local oscillator buffer 1-17, the 90° phase clock and its inverse phase are applied to the composite mixer 1-18a. In essence, this entire path from the quadrature oscillator to the output of the quadrature hybrid transforms the 0° and 90° output of the quadrature oscillator into a single clock on a single line and sends it to the quadrature hybrids of the various transmitters. The single clock is transformed back to 0° and 90° output after the quadrature hybrid. The distance between the quadrature oscillator and the transmitter can be quite large, thereby saving power in sending the clock between these two locations since only a single transmission line is used to send that clock. If the entire length has been sent by a differential line, the power dissipation would be almost twice as large along with the corresponding area impact.

The baseband signal applied to the composite mixer 1-18a is the output signal 1-6a of the phase rotator 1-15a. Although the interconnect on 1-6a is illustrated as a single line, the line actually consists of the baseband in-phase I and quadrature Q signals after the phase rotator. The details of the phase rotator 1-15a are provided in FIG. 2d. The phase rotator 1-15a illustrated accepts a signal I at node 2-12 and a signal Q at node 2-13 separated by 90°. The output of the phase rotator generates a shifted version of the signals I and Q at the two output nodes 2-18 and 2-19. Node 2-18 provides the I' signal and node 2-19 provided the Q' signal still separated by 90°. The prime signals consist of a combination of the two input signals I and Q after passing through the variable gain amplifiers (VGA) 2-15 through 2-17. The input signals I 2-12 and Q 2-13 are combined by the variable gain amplifiers 2-14 and 2-15 which are connected to node 2-18 to generate the I' signal. Thus, by varying the gains of the VGA's 2-14 and 2-15, the signal I' can consist of only the I signal (gain of VGA 2-14 equals 1, gain of VGA 2-15 equals 0), both the in-phase I and quadrature Q signals (gain of VGA 2-14 between 0 and 1, gain of VGA 2-15 between 1 and 0), and only the Q signal (gain of VGA 2-14 equals 0, gain of VGA 2-15 equals 1). Similarly, by varying the gains of the VGA's 2-16 and 2-17, the signal Q' can consist of only the I signal (gain of VGA 2-16 equals 1, gain of VGA 2-17 equals 0), both the in-phase I and quadrature Q signals (gain of VGA 2-16 between 0 and 1, gain of VGA 2-17 between 1 and 0), and only the Q signal (gain of VGA 2-16 equals 0, gain of VGA 2-17 equals 1). Depending on the adjustable gain of the variable gain amplifiers as illustrated by the arrows, the output signals can be shifted anywhere between 0° to 360° from their initial starting point.

Figure 2E:
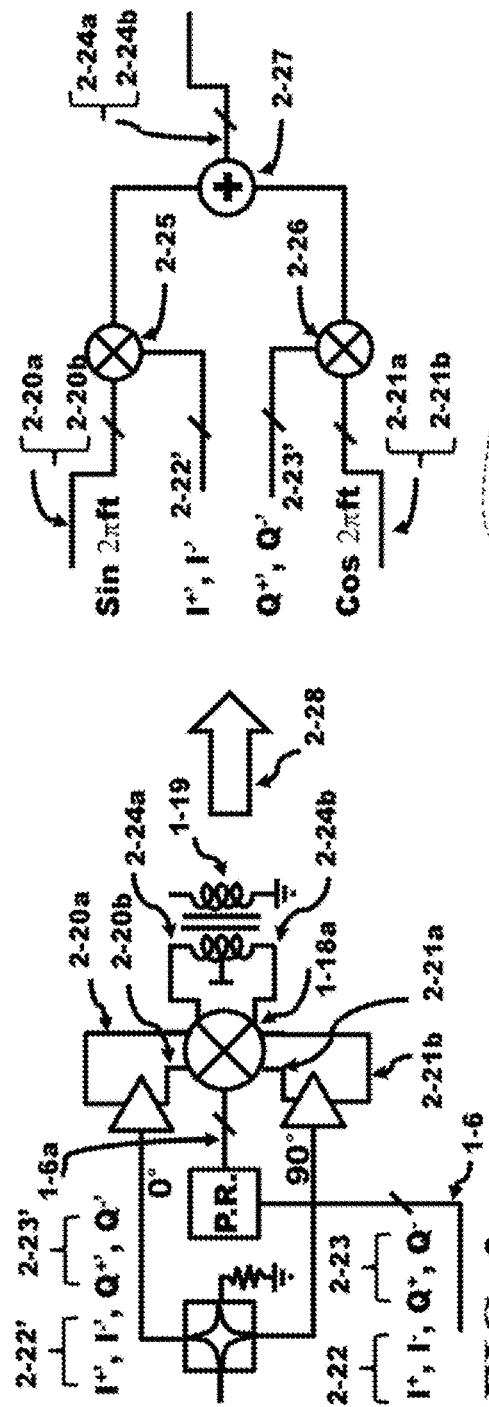
FIG. 2e presents a more detailed description of the mixer.

FIG. 2e illustrates a portion of the circuit provided in FIG. 1a and the arrow 2-28 indicates the details of the composite mixer 1-18a. In particular, the composite mixer 1-18a and its inputs and outputs are labeled. The signals $I^+$ and $I^-$ 2-22 and signals $Q^+$ and $Q^-$ 2-23 on bus 1-6 are coupled to the phase rotator to generate the signals $I^{+'}$ and $I^{-'}$ 2-22' and signals $Q^{+'}$ and $Q^{-'}$ 2-23' on bus 1-6a. The composite mixer 1-18a as indicated by the arrow 2-28 is comprised of the Gilbert mixer 2-25, Gilbert mixer 2-26 and the summer 2-27. The 0° clock signal generates a clock Sin 2πft 2-20a and its inverse −Sin 2πft 2-20b and is coupled to the Gilbert mixer 2-25. The frequency f is substantially equal to 60 GHz. The in-phase signals $I^{+'}$ and $I^{-'}$ 2-22' are also applied to the Gilbert mixer 2-25. The up-converted output of the mixer 2-25 is coupled to the first input of the summer 2-27. The 90° clock signal generates a clock Cos 2πft 2-21a and its inverse −Cos 2πft 2-21b and is coupled to the Gilbert mixer 2-26. The quadrature signals $Q^{+'}$ and $Q^{-'}$ 2-23' are also applied to the Gilbert mixer 2-26. The up-converted output of the mixer 2-26 is coupled to the second input of the summer 2-27. The summer 2-27 adds the two up-converted outputs together to generate the output signals 2-24a and 2-24b. These signals are applied to the inputs of the transformer 1-19 whose output drives the pre-amp.

Figure 3:
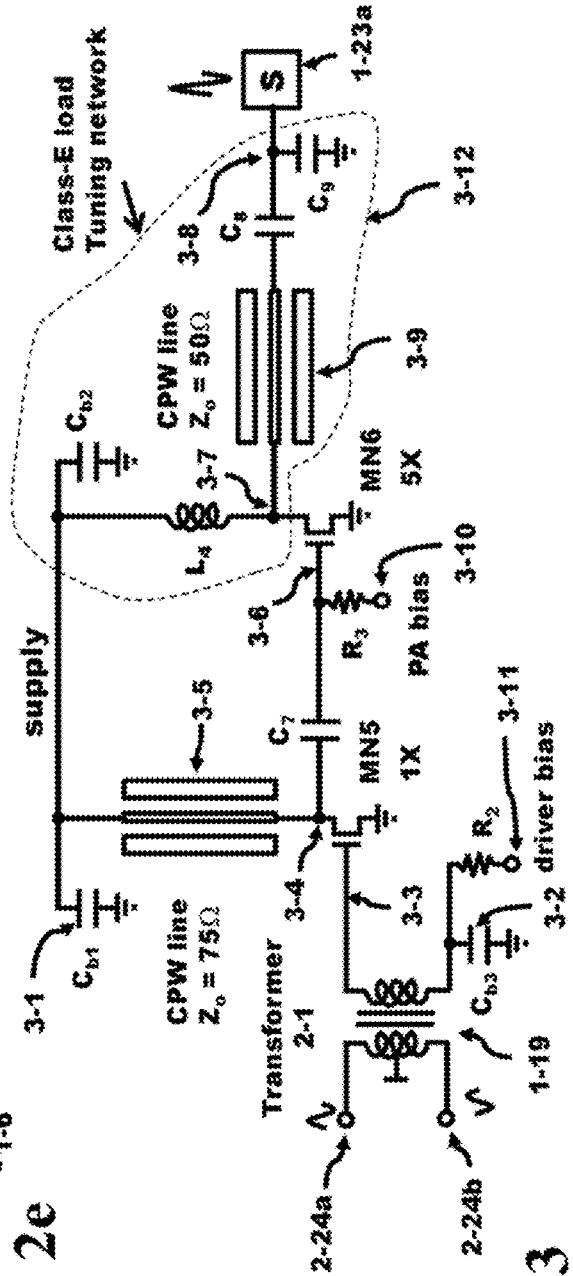
FIG. 3 depicts the circuit diagram of the transformer, pre-drive and power amplifier which includes the power amplifier configured in a Class-E load tuning network in accordance with the present invention.

In FIG. 1a, the transformer 1-19, the preamp 1-20, the power amplifier 1-21 and the signal pad 1-23a in the transmitter 1-25 was presented while FIG. 3 provides a greater detail of these components in the accompanying schematic diagram. A 2:1 balun 1-19 is used at the input of the pre-driver stage to achieve the impedance matching between the high impedance mixer output and the low impedance pre-driver input. The outputs of the composite mixer 1-18a of FIG. 1a are applied to the inputs at nodes 2-24a and 2-24b of the balun 1-19 in FIG. 3. After passing through the balun 1-19, the signal is applied to the gate 3-3 of N-channel transistor MN5. The other output of the balun is connected to an AC ground and is biased through a resistor $R_2$ which is connected to the driver bias at node 3-11. A supply by-pass capacitor $C_{b3}$ 3-2 is placed across resistor $R_2$. The pre-driver stage of the PA is designed as a Class-A stage, maximizing the voltage swing delivered to the gate of the PA switch or transistor. To minimize the inductive coupling between the pre-driver stage and the PA (Power amplifier) stage and in turn ensure PA stability, the resonance network of the driver stage is implemented by a CPW line with an AC coupling capacitor $C_7$. The high-$Z_0$ CPW 3-5 has an impedance of 75 ohms. A capacitor $C_7$ AC couples the output of the drain 3-4 to the gate 3-6 of transistor MN6. The gate 3-6 of N-channel transistor MN6 is biased by the power amplifier (PA) bias through the resistor $R_3$ coupled to node 3-10. The co-planar waveguide impedance 3-5 and capacitor $C_7$ matches the impedance at the output 3-4 of the pre-driver transistor MN5 to the input 3-6 of the driver transistor MN6.

To improve the transmitter efficiency, the final driver stage of the PA adopts a Class-E topology with second harmonic tuning. Harmonic tuning is an effective method to improve the parasitic capacitance tolerance of the Class-E topology and hence reduce the loss due to switching the on-resistance of transistor MN6. In theory, the efficiency keeps improving when more harmonics are tuned, however, in practice, the returns are diminished beyond the second harmonic. Therefore, this design only incorporates second harmonic impedance tuning.

The final stage of the power amplifier consisting of transistor MN6, is configured in a class-E amplifier configuration. Conventionally, the inductance $L_4$ is designed as a choke to short out the fundamental frequency. In order to maintain non-overlapping voltage-current waveforms at the drain of 3-7, the transistor switch MN6 needs to be presented with an open-circuit at the second harmonic of 120 GHz. This is achieved by using a small single-turn inductor L4 which resonates with the drain capacitance 3-7 of MN6 and any interconnect capacitance between the drain and the co-planar waveguide at the second harmonic. N-channel transistor MN6 has a width equal to five times that of MN5. This amplifier uses the distributed inductance of the co-planar waveguide 3-9 which has a characteristic impedance of 50Ω and the capacitance $C_8$ to form the basis Class-E amplifier load to resonate at the fundamental frequency. The series bandpass filter is implemented by a short length CPW in series with capacitor $C_8$, which provides an equivalent short circuit at the fundamental frequency.

Meanwhile, the load tuning network of the PA (Power Amplifier) still needs to satisfy the fundamental impedance constraint for waveform shaping, and this is achieved by adding a shunt capacitor $C_9$ after the series bandpass filter. The combination of the $C_9$, the parasitic drain capacitance of the drain 3-7 of MN6 and $L_4$ generates the required susceptance at the fundamental frequency. Capacitor $C_9$ is blocked from influencing the second harmonic on node 3-7 since the series bandpass filter only passes the fundamental frequency. The effective inductance of the CPW line 3-9 doubles at the second harmonic and therefore provides much higher impedance blocking the drain 3-7 from the load at the output pad 1-23a.

The voltage and current waveforms at drain 3-7 can be shaped such that they are non-overlapping. This minimizes the loss in the transistor MN6 and maximizes the energy provided to the co-planar waveguide 3-9. Thus, the capacitor $C_9$ in conjunction with L4 can be used provide optimize the fundamental frequency behavior of the class E amplifier.

FIG. 4a illustrates a 3-D representation of the co-planar waveguide. The die or chip substrate 4-1 supports the three co-parallel lines 4-2, 4-3 and 4-4. The clock is carried by line 4-3 while the outside lines 4-2 and 4-4 are the ground lines. A cross-section representation of FIG. 4a is illustrated in FIG. 4b. Metal 8 which is copper is used to form the interconnect lines 4-2, 4-3 and 4-4 of the co-planar waveguide which run over the chip or die substrate 4-1 by a distance D. D is approximately 8 microns. The dimensions of A is the width of the ground line 4-2, B is the width of the clock line 4-3 and C is the space difference between the inner clock line 4-3 to the two outside ground lines 4-2. The dimensions A, B and C set the impedance of the coplanar waveguide. For example, to achieve the co-planar waveguide of 50 ohms: A has a value of 10 μm, B has a value of 8 μm and C has a value of 4 μm. For a 75 ohm co-planar waveguide: A equals to 10 μm, B is equal to 4 μm and C is equal to 6 μm.

Figure 5B:
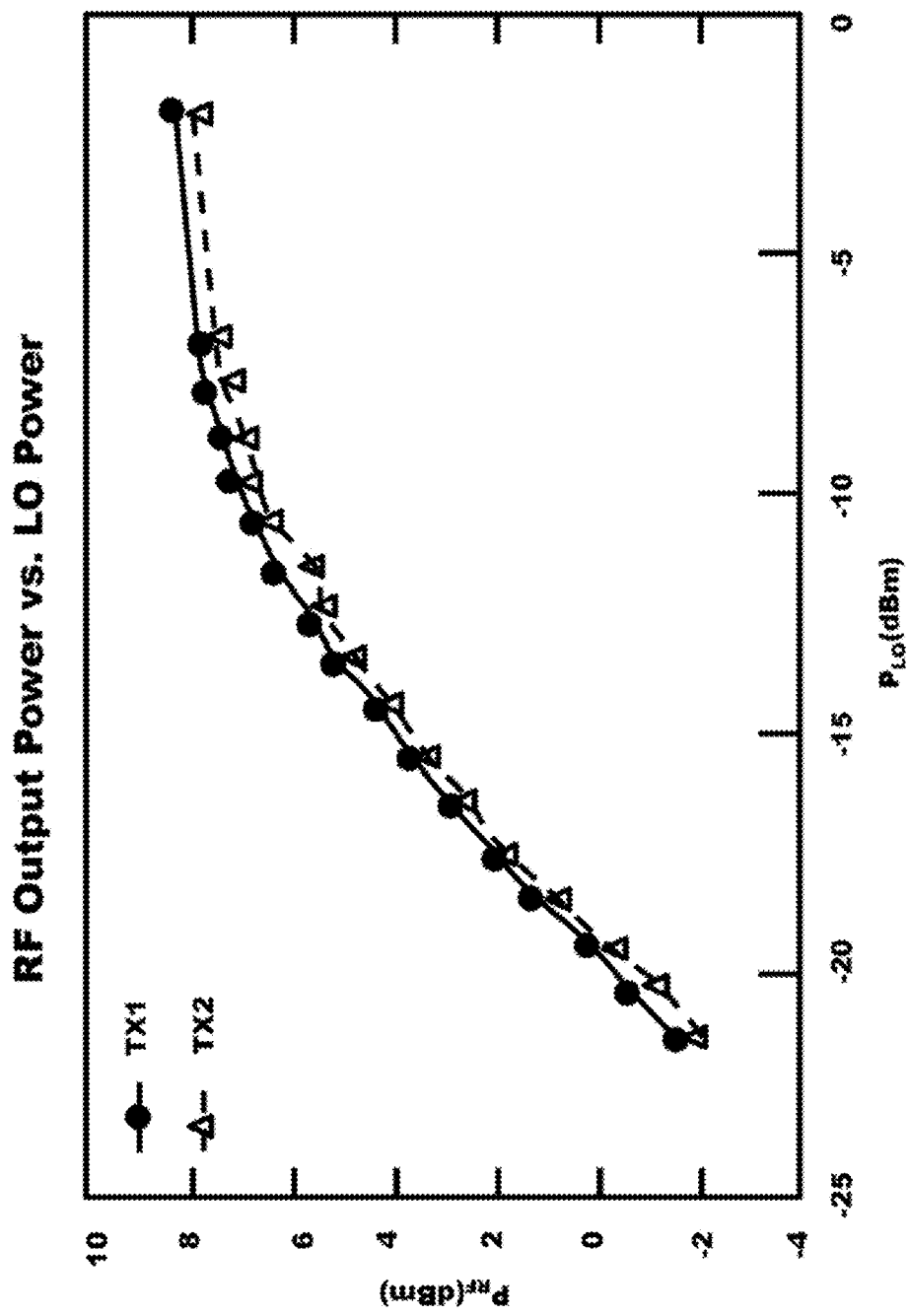
FIG. 5b illustrates the measured results of the output power at the die's pad when driven by the test point shown in FIG. 5a in accordance with the present invention.

FIG. 5a illustrates a test point that is used to provide the test results of FIG. 5b. This test point is inserted between the sinusoid combiner 1-10 and the power divider 1-12 as illustrated in FIG. 5a. Amplifier 5-1 provides the local oscillator test input clock on transmission line 1-11 during the test where the sinusoidal combiner 1-10 is disabled. The test results of applying a 62 GHz clock to the local oscillator test input and measuring the power output at the output signal pads 1-23a and 1-23b of the two transmitters 1-25 and 1-26, respectively, is illustrated in FIG. 5b. The dark circled dots represent transmitter 1 results while the open triangle results represent the transmitter 2 results. It is very desirable to have a power output $P_{RF}$ at 8 dBm at the output pad of the transmitter. As the power of the local oscillator test point is reduced from 0 dBm down to approximately −5 dBm, the power output at the pads remains at approximately 8 dBm which is satisfactory for proper operation at 62 GHz. Thus, a 1 mW input power of the clock provides 8 dBm of gain at the output pad.

Figure 6:
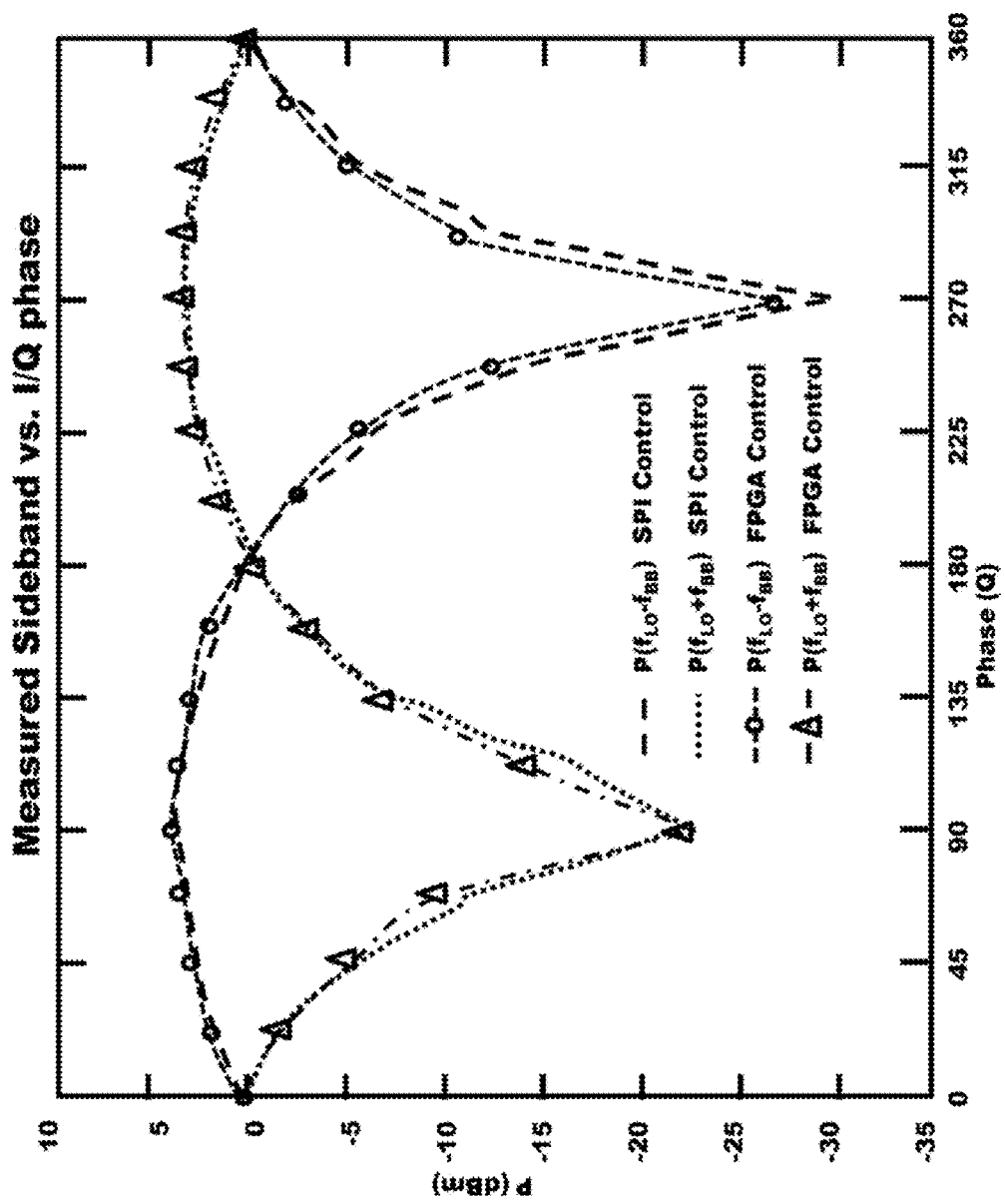
FIG. 6 shows the variation of the I clock as the Q clock is varied in accordance with the present invention.

FIG. 6 depicts the test results that verify the function of the phase rotator. The in-phase I clock is stationary at 0° while the quadrature phase Q clock is swept over 360°. A single baseband frequency $f_{BB}$ is applied to the circuit. The power output results of the measured upper $f_{LO}+f_{BB}$ and lower $f_{LO}-f_{BB}$ sideband responses are presented. Two procedures are performed to adjust the digital control. An external FPGA (Field Programmable Gate Array) is programmed to generate the phased swept baseband Q signal directly. The results for the upper (open triangle) and lower (open circle) sidebands of the FPGA measurements are provided. The second procedure calculates the value of the digital weight and uses the internal SPI (Serial to Parallel) interface on chip to apply the values to the phase rotator. The results for the upper (dotted line) and lower (dashed line) sidebands of the SPI measurements are provided. The digital input to the phase rotator is varied to change the quadrature phase Q clock with respect to the in-phase I clock to perform this sweep. As the quadrature phase Q clock is swept to 90°, the upper sidebands (open triangle and dotted line) are at a minimum while the lower sidebands (open circle and dashed line) are at a maximum. Similarity, as the Q phase is swept to 270°, the upper sideband is at a maximum while the lower sideband is at a minimum.

Note the FPGA (external) results match the SPI (internal) results fairly well, indicating that the phase rotator is performing as expected.

Figure 7:
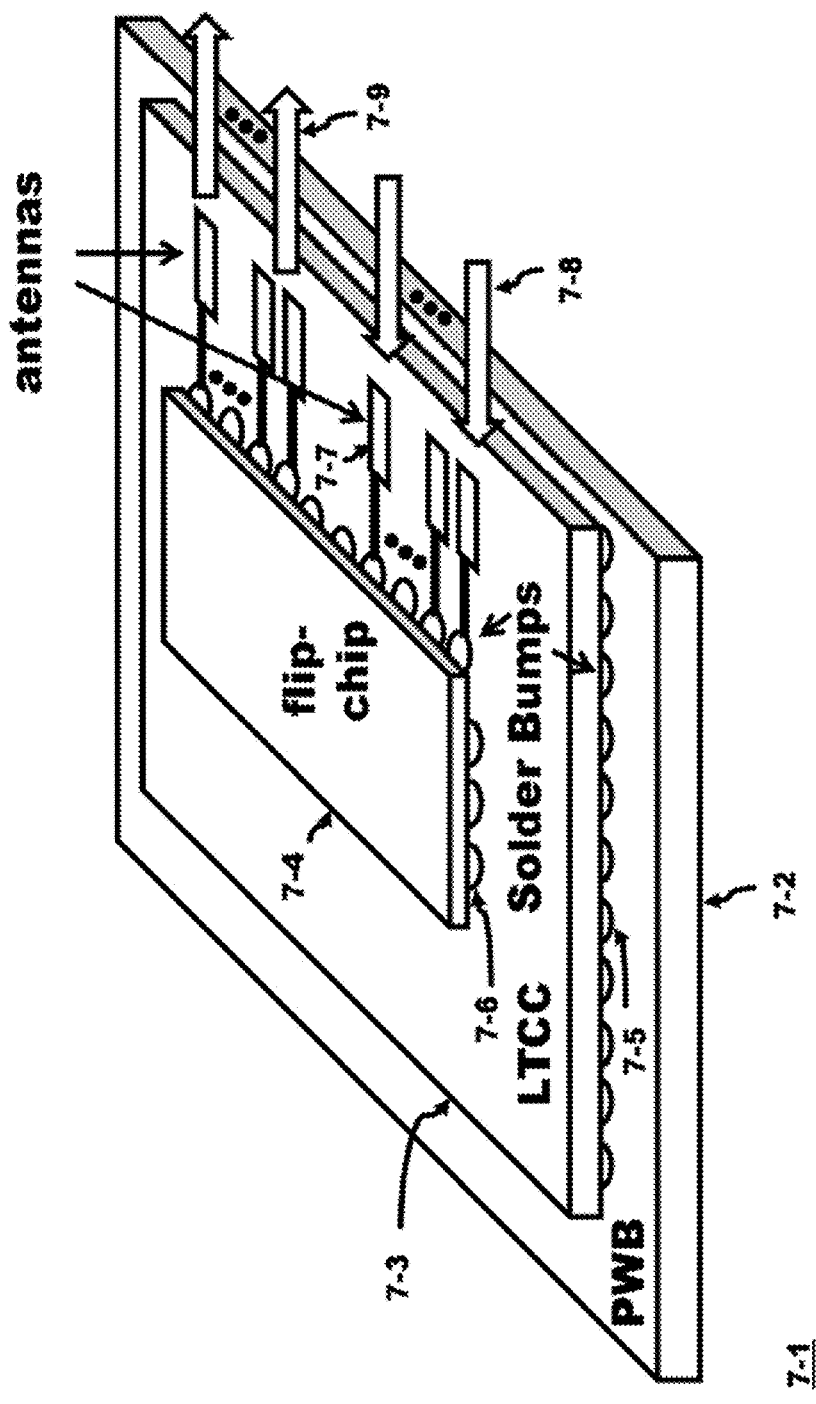
FIG. 7 presents a 3-D representation of the chip containing the beamforming transmitters solder bumped to an LTCC (Low Temperature Ceramic Carrier) substrate which is further solder bumped to a PWB (Printed Wiring Board) board in accordance with the present invention.

FIG. 7 presents a 3-D representation 7-1 of the chip 7-4, LTCC substrate 7-3 and PWB 7-2. The chip 7-4 is solder bumped 7-6, flipped and attached to the top of the LTCC substrate 7-3. The LTCC substrate 7-3 has antennas 7-7 fabricated on its top and bottom surfaces for transmitting and receiving signals to other transceivers in free space. The bottom of the LTCC substrate 7-3 is solder bumped 7-5 to the PWB 7-2. Some of the antennas are used to capture input signals 7-8 from free space or to send out signals 7-9 out to free space. The transmit antennas can use the techniques mentioned in this specification to provide a system of distributing the LO, generating phase rotations, amplification with a class-E amplifier to steer the output waveform into a beam.

A summary of some of the inventive apparatus for a 60 GHz distribution network are provided.

A network comprising a Voltage Controlled Oscillator (VCO) connected to a sinusoidal combiner, the sinusoidal combiner coupled to a power divider, the power divider coupled to a quadrature hybrid, the quadrature hybrid coupled to a local oscillator buffer, the local oscillator buffer connected to a composite mixer, a separate transmission line for each of the couplings and the power divider and the quadrature hybrid formed from lumped reactive components. The lumped reactive components are inductors and/or capacitors. The composite mixer is an up-converter mixer or a down-converter mixer. The transmission line is a co-planar waveguide. The VCO is a quadrature VCO. An in-phase clock and a quadrature clock of the quadrature VCO are applied to the sinusoidal combiner.

An apparatus comprising an in-phase clock and a quadrature clock of a Voltage Controlled Oscillator (VCO) coupled to an input of a sinusoidal combiner, a first composite clock of an output of the sinusoidal combiner coupled to an input of a power divider, a second and a third composite clock coupled to outputs of the power divider, a plurality of transmission lines to transport all the composite clocks and a quadrature hybrid to recover a first in-phase and a first quadrature clock from the second composite clock. Each transmission line transport uses a single co-planar waveguide. The power divider and the quadrature hybrid are formed from lumped reactive components. The first in-phase clock is used to generate a first inverse in-phase clock, a first mixer clocked by the first in-phase and first inverse in-phase clock to up-convert a first signal, the first quadrature clock is used to generate a first inverse quadrature clock, a second mixer clocked by the first quadrature and first inverse quadrature clock to up-convert the first signal and a summer to combine outputs of the first and second mixers. The output of summer coupled to a first transmitter, the first transmitter coupled to a first antenna and the first antenna transmits the up-converted first signal into free space. A second quadrature hybrid to recover a second in-phase and a second quadrature clock from the third composite clock, the second in-phase clock is used to generate a second inverse in-phase clock, a third mixer clocked by the second in-phase and second inverse in-phase clock to up-convert a second signal, the second quadrature clock is used to generate a second inverse quadrature clock, a fourth mixer clocked by the second quadrature and second inverse quadrature clock to up-convert the second signal, a second summer to combine outputs of the third and fourth mixers, the output of second summer coupled to a second transmitter, the second transmitter coupled to a second antenna, and the second antenna transmits the up-converted second signal into free space. A first phase rotator controlled by a first control to generate the first signal and a second phase rotator controlled by a second control to generate the second signal. The transmitted up-converted first signal cause a constructive or destructive interference between the transmitted up-converted second signal such that a beam with greater intensity or less intensity, respectively, can be formed at a particular location in free space dependent on the first and second digital control values.

A method of forming a network, comprising the steps of connecting a Voltage Controlled Oscillator (VCO) to a sinusoidal combiner, coupling the sinusoidal combiner to a power divider, coupling the power divider to a quadrature hybrid, coupling the quadrature hybrid to a local oscillator buffer, connecting the local oscillator buffer to a composite mixer, providing a transmission line for each the couplings and forming the power divider and the quadrature hybrid from lumped reactive components. The lumped reactive components are inductors and/or capacitors. The composite mixer is an up-converter mixer or a down-converter mixer. The transmission line is a co-planar waveguide. Each of the couplings uses only a single co-planar waveguide. The VCO is a quadrature VCO.

A summary of some of the inventive apparatus for a Class E Power Amplifier are provided.

A Class E amplifier comprising a first transistor with a gate, source, drain and substrate, an input coupled to the gate, the source coupled to a ground supply, an inductor coupled between a power supply and the drain, the drain coupled to a first co-planar waveguide in series with a first capacitor and the first capacitor coupled to a signal pad. A second capacitor coupled between the signal pad and the ground supply. The substrate is coupled to the ground supply. The signal pad is coupled to an antenna. An output of a second transistor capacitively coupled to a gate of the first transistor. A second co-planar waveguide coupled between the output of the second transistor and the power supply. An output of a balun coupled to input of the second transistor.

An apparatus comprising an inductor coupled between a power supply and an output of a first transistor, the output of the first transistor coupled to a co-planar waveguide in series with a capacitor and the capacitor coupled to a signal pad. A second capacitor coupled between the signal pad and a ground supply. An output of a second transistor capacitively coupled to a gate of the first transistor. A second co-planar waveguide coupled between the output of the second transistor and the power supply. An output of a balun coupled to the input of the second transistor. The inputs of the balun driven by outputs of a composite mixer that up-converts an input signal. An antenna coupled to the signal pad, whereby the up-converted input signal is propagated into free space from the antenna as electromagnetic radiation.

A method of passing a signal with a fundamental frequency to a signal pad, comprising the steps of coupling the signal to an input of a transistor, coupling an inductor between a power supply and an output of the transistor, coupling the output of the transistor to a co-planar waveguide in series with a first capacitor, coupling the first capacitor to a signal pad and adjusting the co-planar waveguide in series with the first capacitor to a band pass the fundamental frequency, thereby passing the signal with the fundamental frequency to the signal pad. Coupling a second capacitor between the signal pad and a ground supply. Adjusting the inductor to resonate at a second harmonic with a drain capacitance of the transistor. Shaping the waveform at the output of a transistor to constrain the fundamental impedance. Adjusting a value of the second capacitor to achieve a desired susceptance at the fundamental frequency. The current and voltage waveforms at a drain of the transistor non-overlap.

Finally, it is understood that the above description are only illustrative of the principle of the current invention. Various alterations, improvements, and modifications will occur and are intended to be suggested hereby, and are within the spirit and scope of the invention. This invention may, however, be embodied in many different forms and should not be construed as limited to the embodiments set forth herein. Rather, these embodiments are provided so that the disclosure will be thorough and complete, and will fully convey the scope of the invention to those skilled in the arts. It is understood that the various embodiments of the invention, although different, are not mutually exclusive. In accordance with these principles, those skilled in the art may devise numerous modifications without departing from the spirit and scope of the invention. Although the transmitters were described using a CMOS process, other technologies can be used as well. In addition, a network and a portable system can exchange information wirelessly by using communication techniques such as TDMA (Time Division Multiple Access), FDMA (Frequency Division Multiple Access), CDMA (Code Division Multiple Access), OFDM (Orthogonal Frequency Division Multiplexing), UWB (Ultra Wide Band), WiFi, WiGig, Bluetooth, etc. The network can comprise the phone network, IP (Internet protocol) network, LAN (Local Area Network), ad hoc networks, local routers and even other portable systems.

What is claimed is:

1. An apparatus comprising:
an in-phase clock and a quadrature clock of a Voltage Controlled Oscillator (VCO) coupled to an input of a sinusoidal combiner;
a first composite clock of an output of said sinusoidal combiner coupled to an input of power divider;
a second and a third composite clock coupled to outputs of said power divider;
a plurality of transmission lines to transport all said composite clocks;
a quadrature hybrid to recover a first in-phase and a first quadrature clock from said second composite clock;
said first in-phase clock is used to generate a first inverse in-phase clock;
a first mixer clocked by said first in-phase and said first inverse in-phase clock to up-convert a first signal;
said first quadrature clock is used to generate a first inverse quadrature clock;
a second mixer clocked by said first quadrature and said first inverse quadrature clock to up-convert said first signal;
a summer to combine outputs of said first and second mixers;
an output of said summer coupled to a first transmitter;
said first transmitter coupled to a first antenna;
said first antenna transmits into free space said first signal after being up-converted;
a second quadrature hybrid to recover a second in-phase and a second quadrature clock from said third composite clock;
said second in-phase clock is used to generate a second inverse in-phase clock;
a third mixer clocked by said second in-phase and said second inverse in-phase clock to up-convert a second signal;
said second quadrature clock is used to generate a second inverse quadrature clock;
a fourth mixer clocked by said second quadrature and said second inverse quadrature clock to up-convert said second signal;
a second summer to combine outputs of said third and fourth mixers;
an output of said second summer coupled to a second transmitter;
said second transmitter coupled to a second antenna; and
said second antenna transmits into free space said second signal up-converted.

2. The apparatus of claim 1, wherein
each transmission line transport uses a single co-planar waveguide.

3. The apparatus of claim 1, wherein
said power divider and said quadrature hybrid are formed from lumped reactive components.

4. The apparatus of claim 1, further comprising:
a first phase rotator controlled by a first digital control to generate said first signal; and
a second phase rotator controlled by a second digital control to generate said second signal.

5. The apparatus of claim 4, wherein
said first signal after being up-converted and transmitted causes a constructive or a destructive interference between said second signal after being up-converted and transmitted such that a beam with greater intensity or less intensity, respectively, can be formed at a particular location in free space dependent on said first and second digital control values.

6. A method of transmitting signals into free space comprising the steps of:
coupling an in-phase clock and a quadrature clock of a Voltage Controlled Oscillator (VCO) to an input of a sinusoidal combiner;
coupling a first composite clock of an output of said sinusoidal combiner to an input of a power divider;
coupling a second and a third composite clock to outputs of said power divider;
transporting all said composite clocks over a plurality of transmission lines;
recovering a first in-phase and a first quadrature clock from said second composite clock with a quadrature hybrid;
using said first in-phase clock to generate a first inverse in-phase clock;
clocking a first mixer by said first in-phase and said first inverse in-phase clock to up-convert a first signal;
using said first quadrature clock to generate a first inverse quadrature clock;
clocking a second mixer by said first quadrature and said first inverse quadrature clock to up-convert said first signal;
combining outputs of said first and second mixers with a summer;
coupling an output of said summer to a first transmitter;
coupling said first transmitter to a first antenna;
transmitting said first signal after being up-converted into free space with said first antenna;
recovering a second in-phase and a second quadrature clock from said third composite clock with a second quadrature hybrid;
using said second in-phase clock to generate a second inverse in-phase clock;
clocking a third mixer by said second in-phase and said second inverse in-phase clock to up-convert a second signal;
using said second quadrature clock to generate a second inverse quadrature clock;

clocking a fourth mixer by said second quadrature and said second inverse quadrature clock to up-convert said second signal;
combining outputs of said third and fourth mixers with a second summer;
coupling an output of said second summer to a second transmitter;
coupling said second transmitter to a second antenna; and
transmitting said second signal after being up-convened into free space with said second antenna.

7. The method of claim 6, wherein
each transmission line transport uses a single co-planar waveguide.

8. The method of claim 6, wherein
said power divider and said quadrature hybrid are formed from lumped reactive components.

9. The method of claim 6, further comprising the steps of:
controlling a first phase rotator by a first digital control to generate said first signal; and
controlling a second phase rotator by a second digital control to generate said second signal.

10. The method of claim 9, wherein
said first signal after being up-converted and transmitted causes a constructive or a destructive interference between said second signal after being up-converted and transmitted such that a beam with greater intensity or less intensity, respectively, can be formed at a particular location in free space dependent on said first and second digital control values.

* * * * *